(12) United States Patent
Kister

(10) Patent No.: US 6,424,164 B1
(45) Date of Patent: Jul. 23, 2002

(54) PROBE APPARATUS HAVING REMOVABLE BEAM PROBES

(75) Inventor: January Kister, Redwood City, CA (US)

(73) Assignee: Kulicke & Soffa Investment, Inc., Wilmington, DE (US)

( * ) Notice: Subject to any disclaimer, the term of this patent is extended or adjusted under 35 U.S.C. 154(b) by 0 days.

(21) Appl. No.: 09/593,262

(22) Filed: Jun. 13, 2000

(51) Int. Cl.$^7$ ............................................. G01R 31/02
(52) U.S. Cl. ........................ 324/754; 324/761; 439/289
(58) Field of Search ............................... 324/158.1, 754, 324/755, 758, 761, 73.1, 72.5, 500, 725, 757; 439/482, 289, 259

(56) References Cited

U.S. PATENT DOCUMENTS

| | | | | |
|---|---|---|---|---|
| 4,901,013 A | * | 2/1990 | Benedetto | |
| 5,367,254 A | * | 11/1994 | Faure | |
| 5,488,314 A | * | 1/1996 | Brandt | |
| 5,923,178 A | * | 7/1999 | Higgins | |
| 5,945,836 A | * | 8/1999 | Sayre | |
| 6,255,832 B1 | * | 7/2001 | Notohardjono | |
| 6,265,886 B1 | * | 7/2001 | Hamren | |

* cited by examiner

Primary Examiner—Michael J. Sherry
Assistant Examiner—Trung Nguyen
(74) Attorney, Agent, or Firm—Lumen Intellectual Property Services, Inc.

(57) ABSTRACT

An apparatus for electronically testing of bound electrical circuits connected to planar arrayed pads having removable mounted conductive beam probes to simplify the manufacturing and maintaining process. A space transformer comprises from outside electrically accessible conductive holes wherein the guided beam probes are friction resilient resting. In a second embodiment, the friction resilient resting induces a predetermined bending onto the beam probes. This is accomplished by offsetting guiding plates thus imposing a rotational urging on the probe neck within the conductive hole which is just a bare extension of the beam probe.

21 Claims, 8 Drawing Sheets

PROBE APPARATUS HAVING REMOVABLE BEAM PROBES

FIELD OF INVENTION

This invention relates to the field of testing electrical circuits. In particular, this invention relates to an apparatus with removable beam probes for testing bound electrical circuits.

BACKGROUND OF THE INVENTION

In recent years electrical circuits become drastically more complex and smaller at the same time. The numbers of contact pads for transmitting electrical signals from an integrated circuit is rising and the size of the pads is becoming smaller and smaller. Such integrated circuits are usually tested while still on a wafer, or in the bound state. For this purpose the contact pads are contacted by suitable probes which send a series of electronic test signals through the integrated circuit.

A number of prior art design concepts teach cantilever probes for laterally accessing the pads. Other prior art techniques teach to access the pads directly from above by using mechanically resilient, conductive beam probes.

Various design solutions for arranging and guiding those so called "buckling beam probes" have been developed. For more information about buckling beams and probe devices employing them see, for instance U.S. Pat. Nos. 3,806,801; 4,506,215; 4,518,910; 4,686,464 and 4,901,013.

The prior art teaches to bind or attach such buckling beam probes in a mechanically rigid way on one end by soldering them into sockets. Unfortunately, the adhesive and thermal influences during the soldering process disturb the alignment of the beam probes. Therefore, an additional alignment process is required as a final step in the manufacturing of such beam probe assemblies. The thinner those buckling beams become, the more difficult this alignment process becomes.

Before an electrical circuit can be tested, it must be placed in a testing position on a stage. The stage applies an overdrive and lifts the circuit so that each buckling beam contacts a predetermined pad. In most cases the contacting tip of the buckling beam scrubs along the surface of the pad, thereby removing an insulating oxide layer which forms on top of the pad. Those oxidized layers are hard and cause the buckling beam's tip to become abraded over many test cycles. This abrasion does not occur evenly on all pads, causing individual beam tips to abrade faster than others. In addition mechanical stress and irregularities during the testing cycles always cause individual buckling beams to lose their original manufactured shape.

Thus there exists a need for a probe apparatus capable of assembling the beam probes in a way, such that the abrasive processing of the probe tips for alignment and maintaining can be avoided. Additionally, it would be an advance over the prior art to provide a probe apparatus in which the beam probes can be individually replaced. Thus, damaged beam probes could be simply removed and new beam probes inserted in their place.

OBJECTS AND ADVANTAGES

Accordingly, it is a primary object of the present invention to provide a probe apparatus equipped with beam probes which are self-supporting, resilient and removable. It is a further object of the invention to assembly the beam probes in such a way, that during the testing process the beam probes are kept in aligned position to assure the same contact characteristic for each individual beam probe with the designated pad. It is another object of the invention to assembly the beam probes in a way, that a predetermination of the spring characteristic is possible. It is an additional object of the invention to assembly beam probes with a minimal lateral deformation to achieve the highest possible beam probe density. Further objects and advantages will become apparent upon reading the detailed description.

SUMMARY

The object and advantages of the invention are secured by a probe apparatus for contacting pads of an electrical circuit under test. The probe apparatus has a space transformer with a number of electrically conductive holes. The conductive holes can be plated with a conductive material such that they offer an electrically conductive inner surface. The conductive inner surfaces of the holes are connected via horizontal and vertical conductors to connectors on the surface of the space transformer. Those connectors are in electrical communications with the circuitry required to perform the test. The space between the connectors is sufficient for accommodating cables for transmission of other electrical signals. The horizontal and vertical conductors are part of conductor carrier plates, which are a stacked and bound to form a part of the space transformer.

Electrically conductive beam probes are inserted into the conductive holes. The beam probes have a probe tip for contacting the pads, a beam section and a probe neck with a mechanically resilient feature. The beam probes are inserted into the holes by their necks such that the resilient feature frictionally retains the neck. As a result, the beam probe is retained in the hole due to friction resistance.

The mechanically resilient feature retaining the beam probes in the holes can be an undulating section such as a section having a spiral form or a sections with undulations confined to one plane. Alternatively, the resilient feature can be a lateral deformation or a number of deformations which may contact the hole on two opposite sides and at a number of contact points.

Preferably, the holes terminate in a bottom surface and the probe neck of each beam probe rests against this bottom surface. This approach allows the user to achieve better planarity between the probe tips. In addition, the holes may have a rotational positioning feature, such that the neck is urged into a predetermined rotational orientation when inserted. In a first embodiment the probe neck comprises one, two or more lateral manufactured deformations exceeding the contour shape of the conductive hole in disassembled comparison. The lateral deformations can have an undulating shape, expanding in one or more planes or in spiral arrangement. A resilient lateral urging is imposed at a number of contact points on the probe when inserted into the conductive hole.

The probe apparatus can additionally have plates with guiding holes for receiving the beam sections of the beam probes. Also, one or more auxiliary plate can be provided. The holes in the plates can be offset from the holes in the space transformer. In one embodiment, the probe apparatus has a mechanism for laterally displacing the plate and changing the lateral offset. It should also be noted that the holes in the plate can be offset from the holes in the auxiliary plates.

The position and amount of resilient urging of the beam contact points in the conductive hole defines a rotational urging or torque on the beam probe, wherein the rotational urging from only two beam contact points is free of any deflective influence on the probe neck itself. This rotational urging is transmitted onto the beam section and opposed through the guiding holes of one or more of the guiding plates. Such rotational positioning feature may simply be provided by holes with oval or elliptical cross-sections.

In a second particular embodiment the lateral urging on the probe neck is imposed by a rotational urging of the probe neck exceeding the hole boundaries. The rotational urging is imposed by a predetermined bending of the beam section by offsetting the guiding holes of one or more guiding plates out of the alignment along the manufactured shape of the beam section.

The predetermined bending provides a desired spring characteristic over the length of the beam probe against impact of the pad moving towards the probe tip while the bound electrical circuit is placed into testing position.

In yet another embodiment utilizing a first plate with guiding holes the beam probes have necks with mechanically resilient sections. When the necks are inserted into the guiding holes the plate is moved by an adjustment mechanism which laterally displaces the plate. This introduces a lateral offset between the holes in the space transformer and the guiding holes causing the mechanically resilient section to be frictionally retained in the conductive hole. Thus, the beam probes are retained in the space transformer. Of course, the mechanically resilient section may have a mechanically resilient feature such as a lateral deformation or a section which is straight when no mechanical stress is applied.

The details of the invention are explained in the detailed description in reference to the attached drawing figures.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any lose of generality to, and without imposing limitations upon, the claimed invention.

Figure 1:
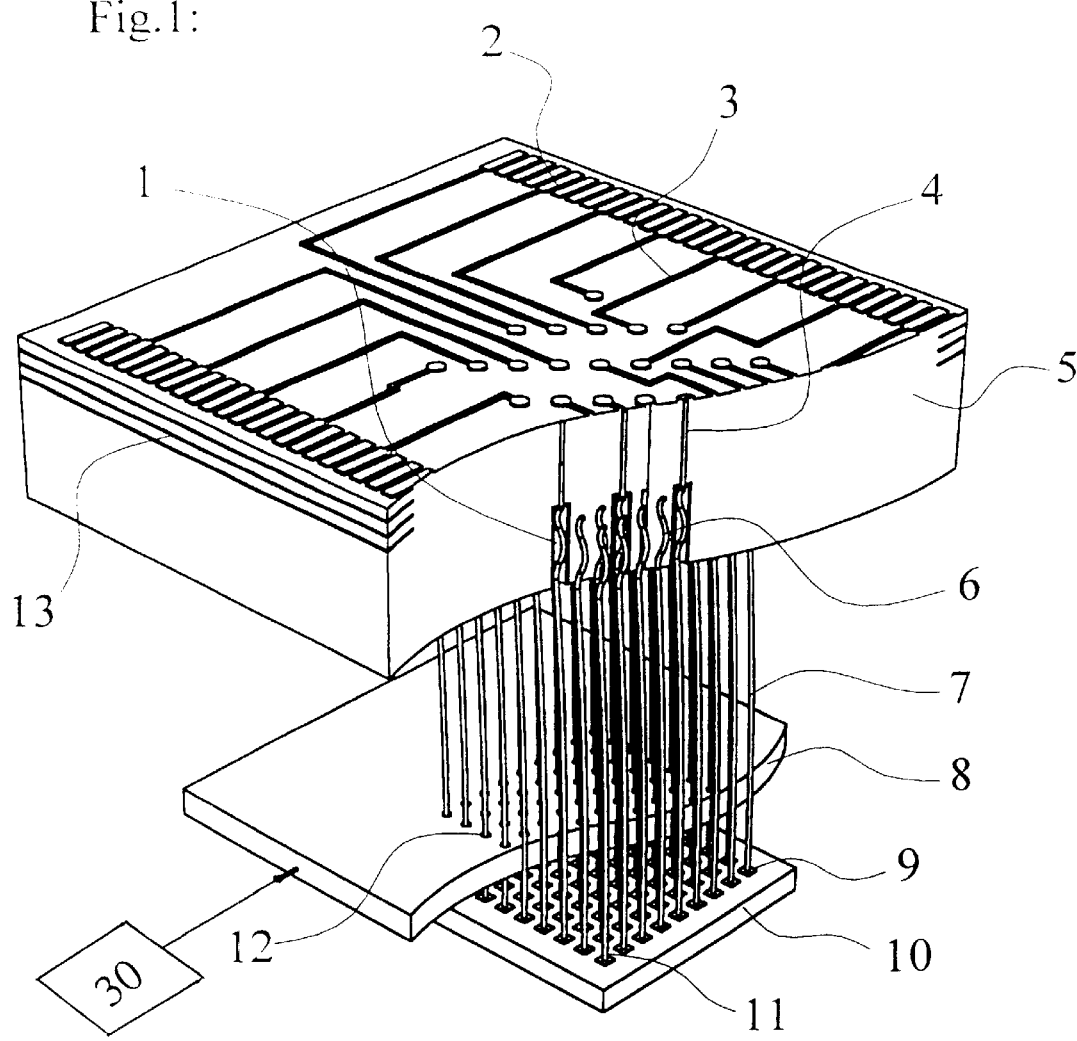
FIG. 1 is a perspective fragmental view of the first embodiment of the invention.

A preferred embodiment of the invention is shown in FIG. 1. FIG. 1 shows the fragmental shape of a space transformer 5 comprising a plurality of electrically conductive holes 1 and a stack of conductor carrier plates 13 as they are bound together in the central area of space transformer 5. Vertical conductors 4 and horizontal conductors 3 electrically connect the outside accessible connectors 2 with the conductive holes 1. FIG. 1 shows only those conductive holes 1 and vertical conductors 4 that become visible where the fragment of the space transformer 5 broken off. A plurality of probe necks 6 is visible where they would be positioned within conductive holes 1 of the missing fragment of space transformer 5.

A plurality of beam probes with their blank probe necks 6, their probe tips 11 and their probe sections 7 is guided in a plurality of guiding holes 12 of a first guiding plate 8. Guiding plate 8 is displayed as a fragment such that an electrical circuit under test 10 comprising a plurality of pads 9 is visible in testing position. In this view probe tips 11 touch pads 9 of circuit 10.

The illustrated assembly is the main functional part of the apparatus. Frame elements, fixtures, cables and other common elements of this apparatus are not shown. The main function of space transformer 5 is to provide conductive holes 1, which are placed so tight together, that a distributing means must be provided. Vertical conductor 4 reaches through layers of carrier plates 13 that distribute the electrical signals with their horizontal conductors 3 in a predetermined way to the outside accessible connectors 2. The connectors 2 are placed on the outside periphery of space transformer 5 in sufficient distance to each other, so that cables for further transmission of signals to and from a testing circuit can be easily attached without unreasonable spatial constraints.

Conductive holes 1 are placed in an array arrangement and are in electrical contact with the arrangement of pads 9. Each conductive hole 1 holds by means of a friction hold the mechanically resilient probe neck 6 that continues as a mechanical resilient beam section 7. Conductive holes 1 can have a rotationally symmetric shape or a particular pronounced contour, e.g., an elliptical or oval contour, to urge probe neck 6 into a predetermined rotational orientation. This predetermined rotational orientation can be also achieved by shaping beam section 7 such that guiding holes 12 of first guiding plate 8 capture beam section 7 in an offset position from the rotational axis of guiding hole 12.

Space transformer 5 and guiding plate 8 are independently mounted, such that the conductive holes 1 are accessible during the manufacturing of the apparatus. Preferably, guiding plate can be shifted or moved by an adjustment means 30, to alter the offset between conductive holes 1 and guiding holes 12.

Electrical circuit 10 is held in testing position such that pads 9 are aligned with the corresponding probe tip 11. The length and shape of beam section 7 allow the beam probe to deflect by a predetermined amount, to provide a resilient contact between probe tips 11 and pads 9. Specifically, the length and shape of beam section 7 is calculated to obtain desired scrub characteristics of tip 11 on pad 9.

Beam sections 7 are preferably covered with and insulating layer to avoid electrical contact between them. The beam probes are manufactured from wire material. The specific shaping of the probe neck 6 are achieved by one or more bending operations or by plastic deformation of the section shape of the wire material.

Figure 2:
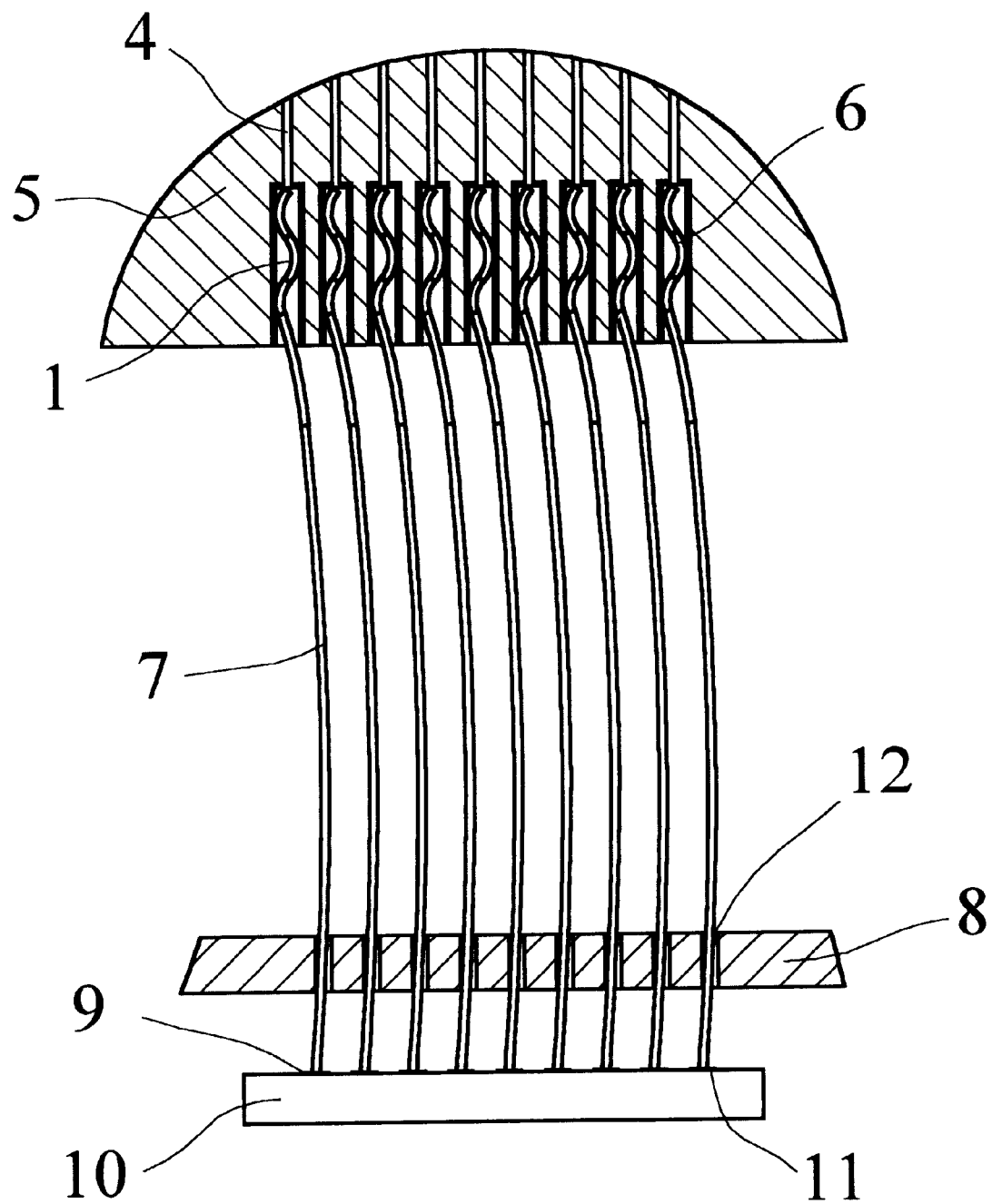
FIG. 2 is a schematic view of the first embodiment of the invention.

FIG. 2 is a schematic view of the first embodiment of the invention showing a fragment of space transformer 5 in a cross sectional view, illustrating conductive holes 1 and vertical conductors 4. The blank probe necks 6 are fully visible in assembled position. Guiding plate 8 is also in fragmental cut view such that each beam section 7 is fully visible in its predetermined bending position guided through guiding holes 12. Each probe tip 11 touches a corresponding pad 9 of electrical circuit 10 in testing position. This schematic view gives a clear understanding about the inventive concept. It shows, how the resilient deflection of each probe neck 6 with an undulating resilient feature imposes a rotational urging on beam section 6. Since beam section 7 is held in position at its lower end by guiding holes 12, the rotational urging or torque causes beam section 7 to bend out of its manufactured shape. For example, as show in FIG. 1 the manufactured shape is meant to be straight; thus the bending of beam section 7 is obvious. Guiding holes 12 are laterally offset from the rotational axis of conductive hole 1 urging the beam probes into the same rotational orientation in assembled position. Guiding plate 8 with the lateral offset therefore is essential for a proper positioning and retention of the beam probes within the assembly.

Figure 3:
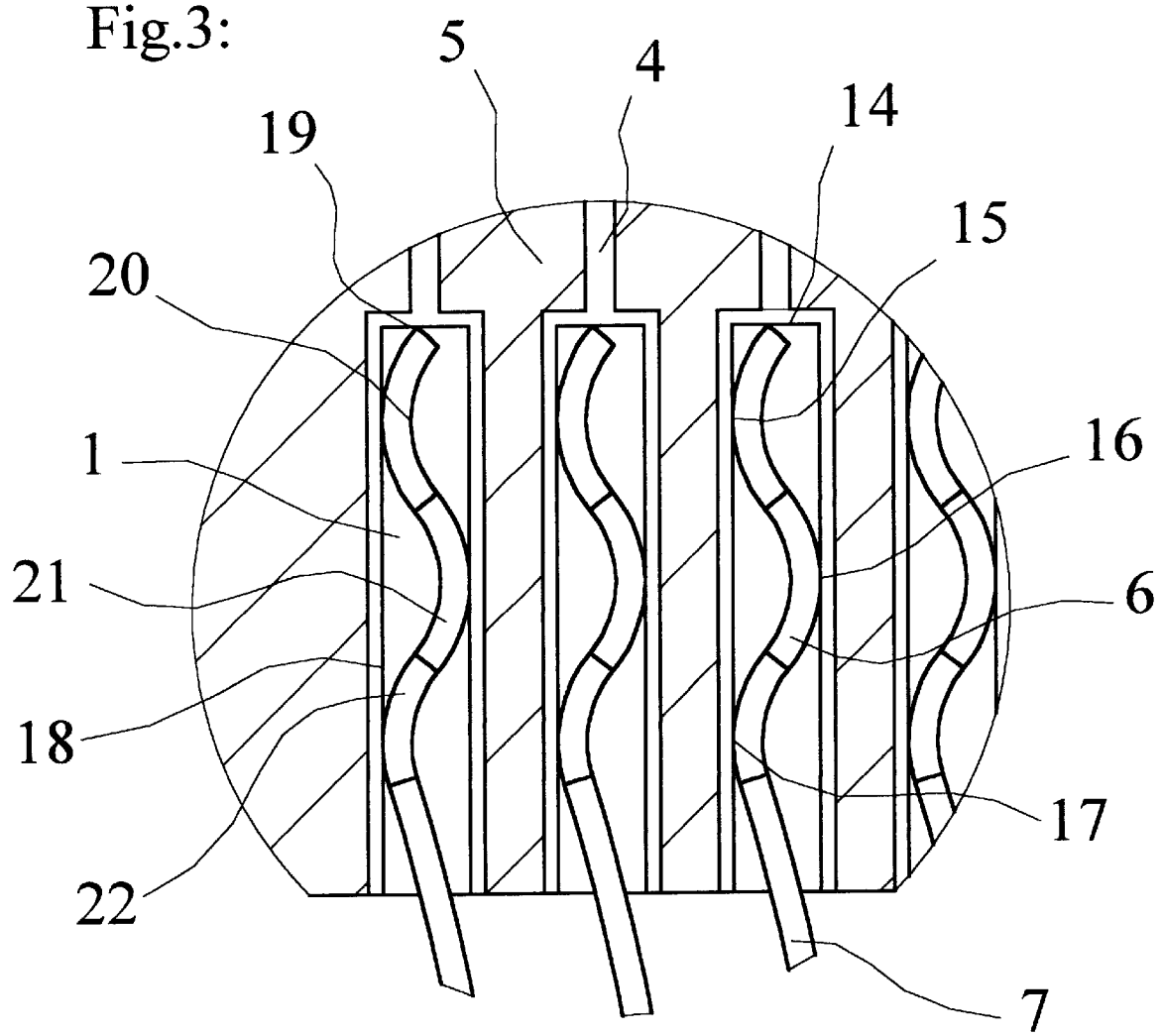
FIG. 3 is an enlarged fragmental view of FIG. 2.

FIG. 3 is an enlarged fragmental view of FIG. 2, showing a fragment of space transformer 5 in a cross-sectional view showing vertical conductors 4 and conductive holes 1. A smaller number of beam probes 7 with their probe necks 6 is visible in assembled position inserted into conductive holes 1. Each blank probe neck 6 is shown for example with a plurality of first, second and third lateral deformations 22, 21, 20 exposed to lateral urging on contact at a first, second and third contact points 17, 16, 15 with a conductive surface 18 of conductive holes 1. Each probe neck 6 touches with a vertical beam alignment contact 19 at a hole bottom 14, whereby a predetermined longitudinal position of the beam probe within conductive holes 1 is imposed.

In FIG. 3 lateral deformations 22, 21, 20 are shown for example as bends or undulations in one plane. Depending on placement and number of contact points 17, 16, 15 (in this case three) along two or more planes, or on opposite sides of holes 1, probe neck 6 can have a uniform radial cross section and its longitudinal shape will determine its final position within conductive hole 1. In that case, the guiding plate is necessary to provide a rotational orientation. The resilient deflection of probe neck 6 between the lateral deformations 22, 21, 20 imposes a rotational urging or a torque on beam section 7. Electrically conductive surface 18 is a metal, e.g., copper, plated on the inner surface of conductive holes 1. During the assembly the probe necks are placed or inserted into conductive holes 1. The friction resistance at contact points 15, 16, 17 is defined by the amount by which lateral deformations 22, 21, 20 exceed the cross-sectional dimension or inside contour of conductive hole 1. The frictional resistance is high enough to hold the beam probes with their weight against gravitational forces and with their mass against acceleration forces in assembled position. In other words, the neck is retained within hole 1 with sufficient force to retain entire beam probe. Acceleration forces occur through external forces and movements imposed onto the apparatus. The friction resistance is low enough to accomplish an assembly within the conductive holes, without deforming beam section 7.

Figure 4:
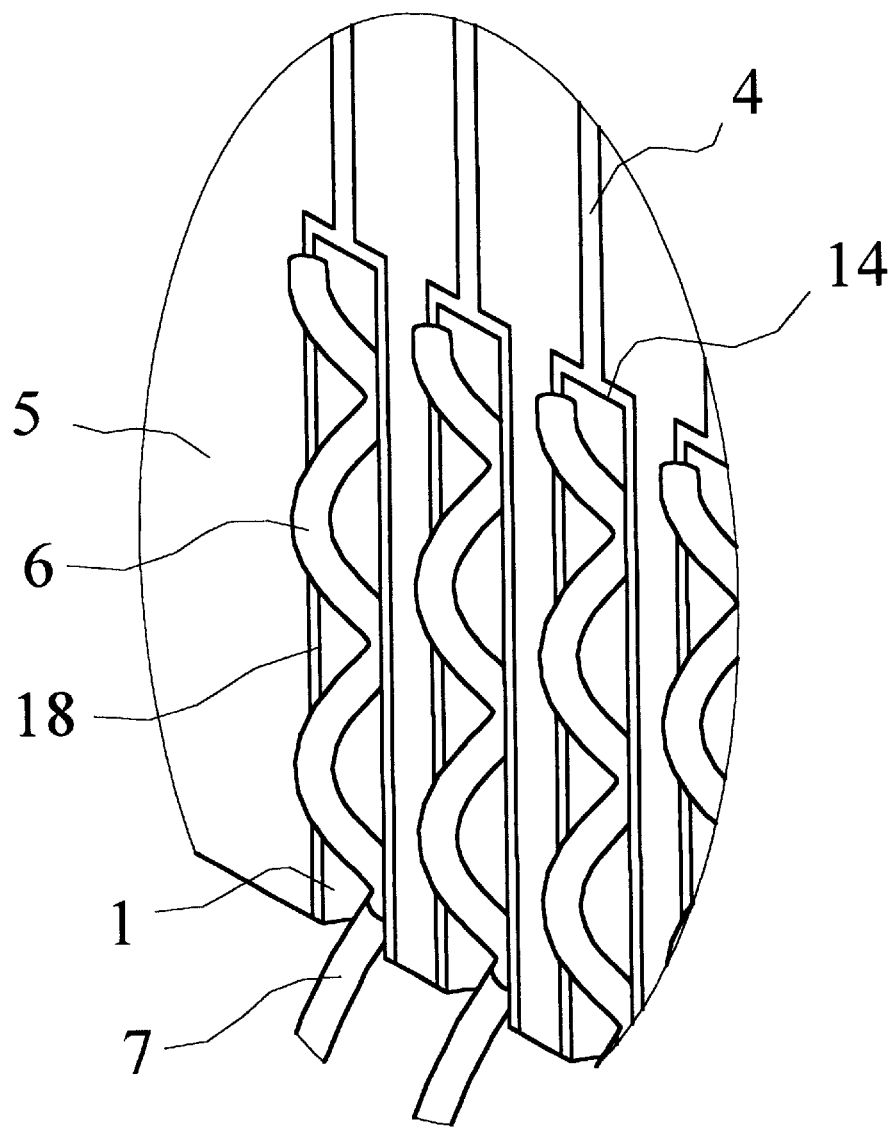
FIG. 4 is a perspective fragmental view onto a cut section of the space transformer along an array of conductive holes, showing a variation of the first embodiment of the invention.

FIG. 4 is a perspective fragmental view of a cross-section of space transformer 5 along an array of conductive holes 1, showing a variation of the first embodiment of the invention. For example, space transformer 5 is shown cut through along an array of conductive holes 1. Conductive holes 1 with their conductive surface 18, their hole bottom 14 and vertical conductor 4 are also shown cut along the same plane. Each probe neck 6 is shown in the form of a spiral. The spiral shape of probe neck 6 allows a linear contact between probe neck 6 and conductive surface 18. Probe neck 6 has a longitudinal resilience against the impact or force translated from pads 9 as they are brought into testing position. Probe neck 6 is resting in a radially and longitudinal well-defined position. A guiding plate is just necessary to provide a rotational orientation. The enhanced spring characteristic of probe neck 6 allows a minimal scrubbing between the probe neck 6 and the conductive surface 18 to keep the contact area free of insulating oxidation layers.

Figure 5:
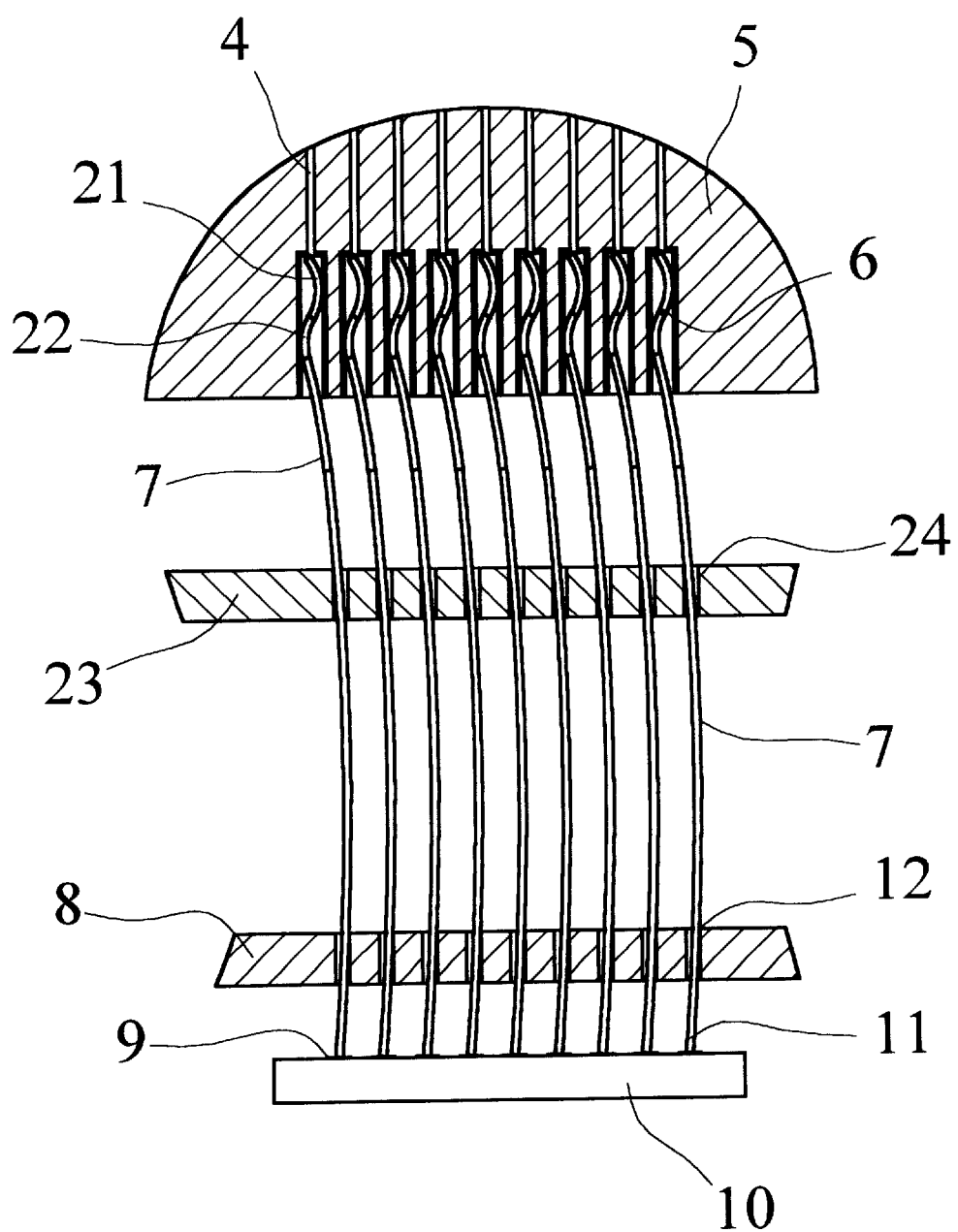
FIG. 5 is a schematic view of a variation of the first embodiment of the invention with two lateral deformations on a blank probe neck.

FIG. 5 is a schematic view of a variation of the first embodiment of the invention showing for example a fragment of space transformer 5 in cross-sectional view, illustrating conductive holes 1 and the vertical conductors 4. First guiding plate 8 and an auxiliary guiding plate 23 with a plurality of auxiliary guiding holes 12, 24 are also shown. Beam probes 7 are fully visible in their predetermined bending direction guided through guiding holes 12, 24. Each probe tip 11 is touching on the corresponding pad 9 of electrical circuit 10 under test.

Each probe neck 6 has a first and a second lateral deformation 21, 22. The rotational urging is imposed on beam section 7 by opposing lateral urging at the contact points and the longitudinal offset along the probe neck 6. In case of only two contacting points as shown in FIG. 5 the rotational urging is not opposed by an internal bending resistance as it was described for FIG. 3. Thus a much higher rotational force is imposed on the beam section 7. To support this higher rotational urging auxiliary guiding plate 23 is positioned in an area of maximum deflection of beam section 7.

Figure 6:
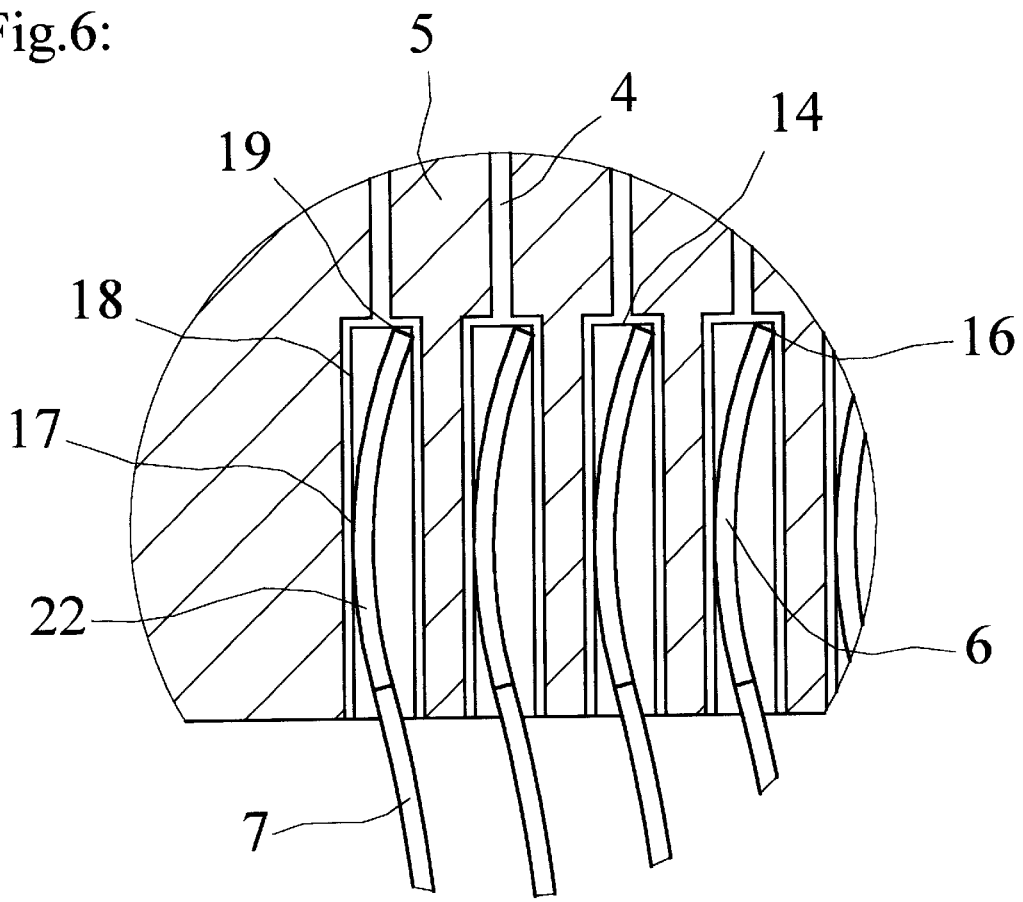
FIG. 6 is an enlarged fragmental view of a variation of the first embodiment of the invention with one lateral deformation on a blank probe neck.

FIG. 6 shows a fragment of space transformer 5 in cross-sectional view. A number of beam probes 7 with their blank probe neck 6 is visible in assembled position inserted into conductive holes 1. In this embodiment each probe neck 6 has a sole lateral deformation 22 exposed to lateral forces at first and second contact points 17, 16 with conductive surface 18 of the conductive holes 1. This forces a free rotational urging on probe neck 6. Blank probe neck 6 touches with a vertical beam alignment contact 19 at hole bottom 14, such that a predetermined longitudinal position of neck 6 within the conductive hole 1 is imposed.

In the embodiment of FIG. 6 even with only one lateral deformation 22 the required minimal number of two opposing contact points 16, 17 is achieved. Thus, the end of probe neck 6 is contacting on the hole bottom 14 and conductive surface 18 simultaneously.

In another variation of the example shown in FIG. 5 the singular lateral deformation 22 is not manufactured by a bending operation, but by squeezing the contour shape of the wire profile of the beam probe. In that manner a more or less symmetric positioning of first and second beam contact points 17, 16 can be defined. The closer first and second beam contact points 17, 16 are positioned, the higher the lateral urging against the conductive surface 18 in proportion to the rotational urging on beam section 7. By squeezing the profile the section shape becomes also a profile contour less flexible and with higher strength in the direction of the rotational urging. No rotational urging occurs, if first and second contact points 17, 16 are on the same longitudinal position. If the proportion of depth and width of conductive holes 1 is adjusted such that the probe neck can be inserted at an angle, and such that the lateral distance between the two contact points 17, 16 is reduced enough to allow assembly, a locking effect is achieved in the final orientation of neck 6.

Figure 7:
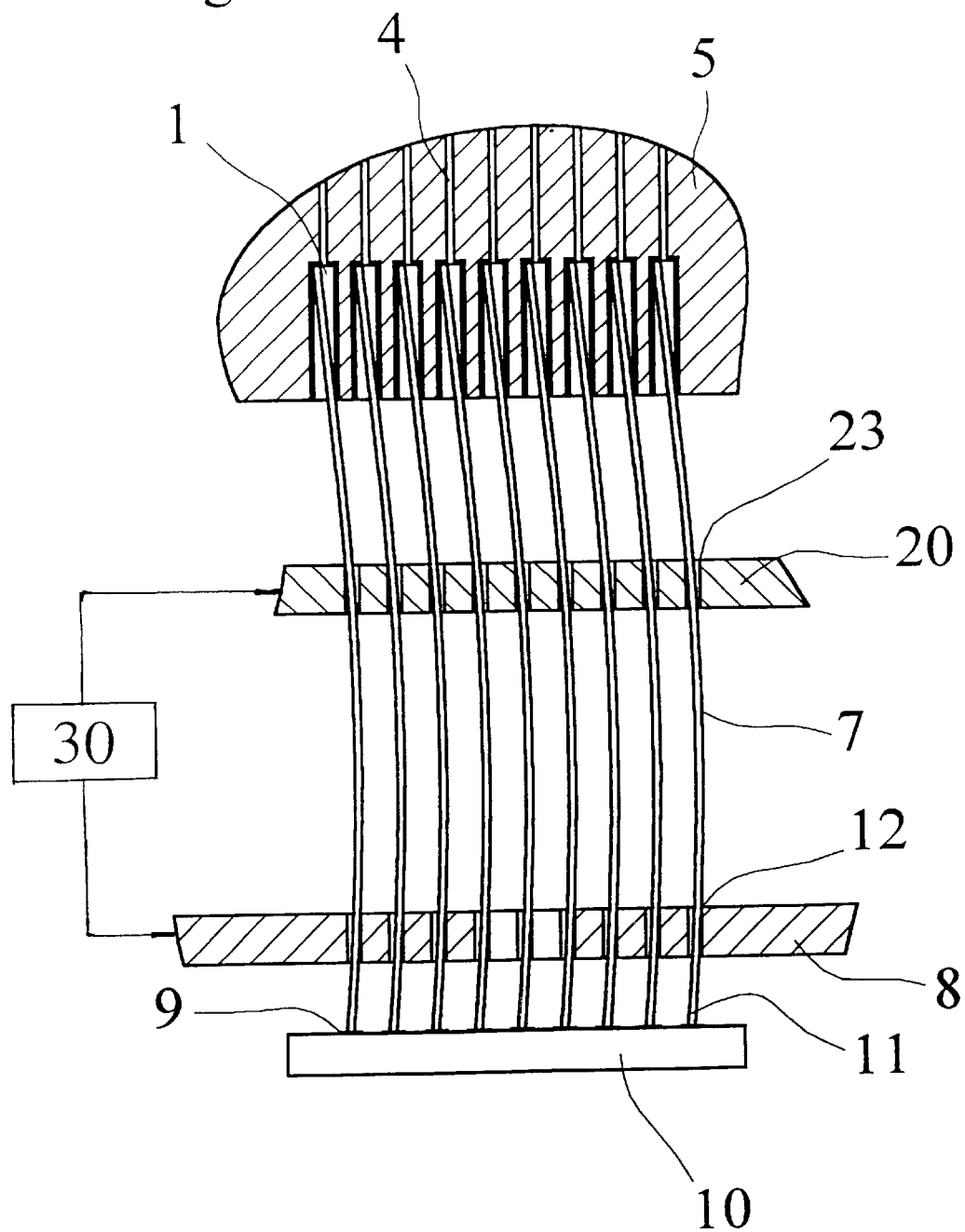
FIG. 7 is a schematic view of the second embodiment of the invention.

FIG. 7 is a schematic view of the second embodiment of the invention showing a fragment of space transformer 5 in cross-sectional view. Guiding plate 8 and an auxiliary guiding plate 23 with a plurality of guiding holes 12, 24 are also in fragmental cross-sectional view such that beam sections 7 are fully visible in their predetermined bent positions guided through guiding holes 12, 24. Each probe tip 11 is touching pad 9 of bound electrical circuit 10 in testing position.

Probe neck 6 in this case is a mechanically resilient section. Specifically, neck 6 is a straight continuation of beam section 7. The rotational tendency of the beam probe is limited by resilient contact between neck 6 and conductive surface 18 at first and second beam contact points 17, 16. These contact points cause a lateral urging on probe neck 6. The beam probe in the second embodiment of the invention has a continues profile shape without any lateral deformations on the probe neck section 6. Of course, it is possible for neck 6 to have mechanically resilient features, as described above.

This probe apparatus is most easily assembled by passing the beam probes through guiding holes 12, 24 which are in aligned position along the manufactured shape of the beam probes during the assembly process. A lateral offset is applied to one or more guiding plates, in this case plates 8, 23 with the aid of an adjustment means 30 after the assembly is complete. The most practical variation of the second embodiment of the invention are straight beam probes, allowing a straight alignment of guiding holes 12, 24 with conductive holes 1 and a linear assembly of beam probes. The second embodiment of the invention accommodates the highest density of beam probes. The width of conductive holes 1 only needs to guarantee the successful placement of the beam probes. No dimensional considerations as they are necessary for a soldering process limit the narrowing of the lateral distance between the beam probes. The closer auxiliary guiding plate 23 is placed to conductive holes 1, the more effective the rotational urging on the probe neck.

Figure 8:
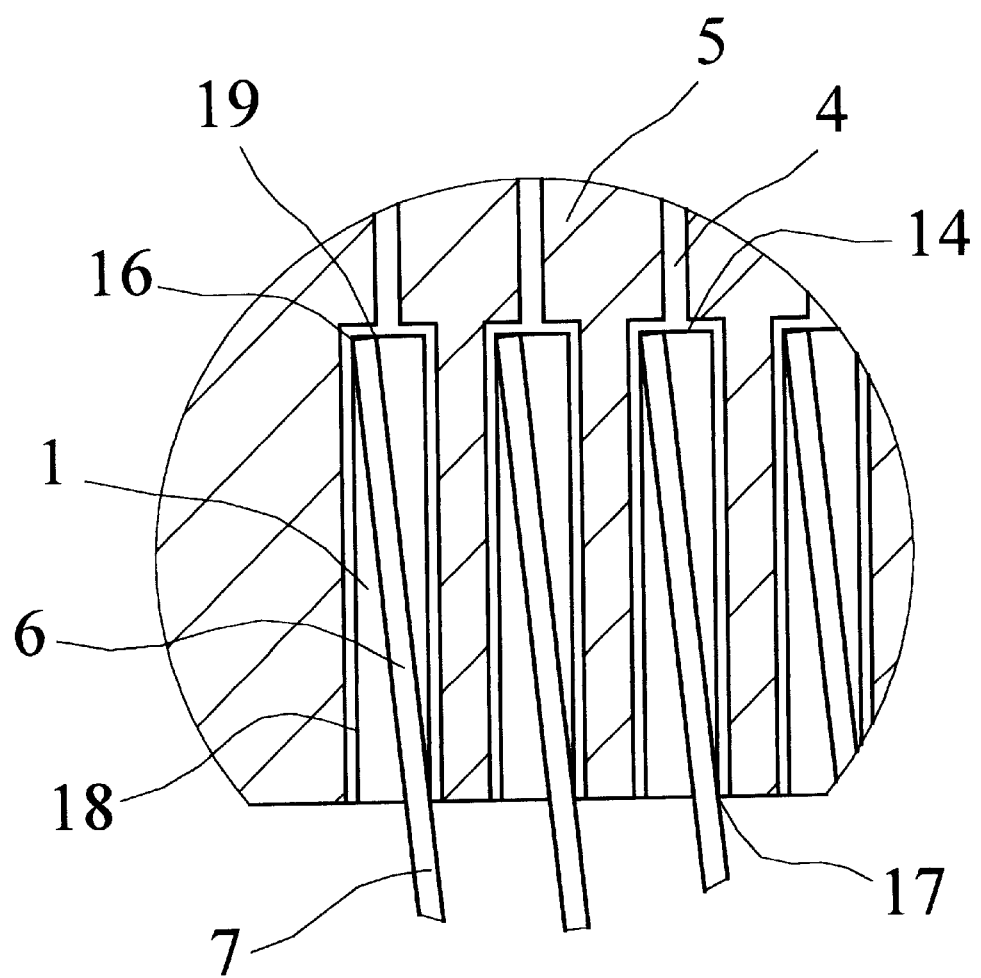
FIG. 8 is an enlarged fragmental view of FIG. 6.

FIG. 8 is an enlarged fragmental view of FIG. 6, showing a fragment of the space transformer 5 in cross-section. A small number of beam sections 7 with their blank probe necks 6 is visible in assembled position inserted into conductive holes 1. Blank probe necks 6 are a continuation of beam sections 7 exposed to lateral urging by contact forces at contact points 16, 17 with conductive surface 18 of conductive holes 1. Each probe neck 6 touches with a vertical beam alignment contact 19 hole bottom 14, whereby a predetermined longitudinal position of probe neck 6 within conductive hole 1 is imposed. The rotational urging imposed on beam section 7 causes probe neck 6 to press laterally at second beam contact point 16 and in an opposing direction at beam contact point 17 close to the edge of conductive hole 1.

The conductive holes 1 may have cross-sections that are other than circular. In combination with fabrication techniques that utilize masks, the cross sections may be defined in combination with the resolution characteristics of the selected masking technique. For the example of a masking technique with a square pixel resolution, the cross section of the conductive holes 1 may be rectangular and/or square.

For other than circular cross sections of the conductive holes 1, the cross sections of the beam probes 7 may be circular and/or rectangular and/or square. In addition, the cross section of the conductive holes 1 may have a geometry that corresponds to the manner the contact pads 9 are arranged. For instance, in the case when the contact pads 9 are arranged in a body-centered manner, the cross sections of the conductive holes 1 and/or the beam probes 7 may be triangular.

In the case when the beam probes have a cross section that corresponds with its geometry to that of the conductive holes 1, the first, second and third contacting points 17, 16, 15 may become contacting lines.

Further, in the case of conductive holes 1 with cross section that are other than circular, the first, second and/or third lateral deformations 22, 21, 20 may be oriented in correspondence with corners and or lateral section extensions of the conductive holes 1.

Accordingly, the scope of the invention should be determined by the following claims and their legal equivalents:

1. A probe apparatus for contacting pads of an electrical circuit under test, said probe apparatus comprising:
   a) a space transformer with electrically conductive holes; and
   b) electrically conductive beam probes, at least one of said electrically conductive beam probes having:
      1) a probe tip for contacting one of said pads;
      2) a beam section; and
      3) a probe neck having a preformed mechanically resilient section,
      said mechanically resilient section of said probe neck being frictionally retained and self-supported in said electrically conductive holes.

2. The probe apparatus of claim 1, further comprising a first plate between said space transformer and said electrical circuit under test, said first plate having guiding holes for accepting said beam section of said electrically conductive beam probes.

3. The probe apparatus of claim 1, wherein said mechanically resilient section is an undulating section.

4. The probe apparatus of claim 3, wherein said undulating section has a spiral form.

5. The probe apparatus of claim 3, wherein said undulating section comprises undulations in one plane.

6. The probe apparatus of claim 1, wherein said mechanically resilient section is a lateral deformation.

7. The probe apparatus of claim 6, wherein said lateral deformation has two contact points on opposing sides of said electrically conductive holes.

8. The probe apparatus of claim 6, wherein said lateral deformation comprises a number of undulations placed along said probe neck.

9. The probe apparatus of claim 6, wherein said lateral deformation comprises two or more contact points within said conductive hole.

10. The probe apparatus of claim 1, wherein at least one of said electrically conductive holes are plated with a conductive material.

11. The probe apparatus of claim 1, wherein at least one of said electrically conductive holes terminates in a bottom surface and said probe neck of each of said beam probes rests against said bottom surface.

12. The probe apparatus of claim 1, wherein at least one of said electrically conductive holes comprises a rotational positioning means, wherein said probe neck is urged into a predetermined rotational orientation.

13. The probe apparatus of claim 1, further comprising an adjustment means for laterally displacing said first and changing said lateral offset.

14. The probe apparatus of claim 1, further comprising at least one auxiliary plate having auxiliary guiding holes for accepting said beam section of said beam probes.

15. The probe apparatus of claim 14, wherein said auxiliary guiding holes of said auxiliary guiding plate are offset from said guiding holes of said first guiding plate.

16. A probe apparatus for contacting pads of an electrical circuit under test, said probe apparatus comprising:

a) a space transformer with electrically conductive holes;
b) electrically conductive beam probes, each of said electrically conductive beam probes having:
   1) a probe tip for contacting one of said pads;
   2) a beam section; and
   3) a probe neck comprising a preformed mechanically resilient section,
   said mechanically resilient section of said probe neck being frictionally retained and self-supported in said electrically conductive holes;
c) a first plate between said electrical circuit under test and said space transformer, said plate having guiding holes for accepting said beam section of said electrically conductive probe beam; and
d) an adjustment means for laterally displacing said first plate to introduce a lateral offset between said first guiding holes and said electrically conductive holes.

17. The probe apparatus of claim 16, wherein said mechanically resilient section is a lateral deformation.

18. The probe apparatus of claim 16, wherein said conductive holes are plated with a conductive material.

19. The probe apparatus of claim 16, wherein each of said conductive holes terminates in a bottom surface and said probe neck of each of said beam probes rests against said bottom surface.

20. The probe apparatus of claim 16, further comprising a second guiding plate having guiding holes for accepting said beam section of said beam probes.

21. The probe card of claim 20, wherein said guiding holes of said second guiding plate are offset from said guiding holes of said first guiding plate.

* * * * *